United States Patent
Anapolsky et al.

(10) Patent No.: US 9,455,437 B2
(45) Date of Patent: Sep. 27, 2016

(54) SOLID-STATE BATTERIES UTILIZING TEMPLATE LAYERS FOR ELECTRODE FORMATION AND METHODS FOR FORMING THE SAME

(71) Applicant: Intermolecular, Inc., San Jose, CA (US)

(72) Inventors: Abraham Anapolsky, San Mateo, CA (US); Minh Huu Le, San Jose, CA (US); Jeroen Van Duren, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 175 days.

(21) Appl. No.: 14/509,776

(22) Filed: Oct. 8, 2014

(65) Prior Publication Data
US 2016/0233541 A1  Aug. 11, 2016

(51) Int. Cl.

| | |
|---|---|
| H01M 4/04 | (2006.01) |
| H01M 4/1391 | (2010.01) |
| H01M 4/36 | (2006.01) |
| H01M 4/52 | (2010.01) |
| H01M 4/525 | (2010.01) |
| H01M 4/66 | (2006.01) |
| H01M 10/0561 | (2010.01) |
| H01M 10/0562 | (2010.01) |
| H01M 10/056 | (2010.01) |
| H01M 10/0585 | (2010.01) |
| H01M 10/0525 | (2010.01) |
| H01M 10/052 | (2010.01) |

(Continued)

(52) U.S. Cl.
CPC ............... *H01M 4/04* (2013.01); *C23C 14/34* (2013.01); *C23C 14/3414* (2013.01); *C23C 14/3464* (2013.01); *H01M 4/0402* (2013.01); *H01M 4/0404* (2013.01); *H01M 4/0407* (2013.01); *H01M 4/0421* (2013.01); *H01M 4/0423* (2013.01); *H01M 4/0426* (2013.01); *H01M 4/1391* (2013.01); *H01M 4/366* (2013.01); *H01M 4/52* (2013.01); *H01M 4/525* (2013.01); *H01M 4/66* (2013.01); *H01M 4/661* (2013.01); *H01M 10/052* (2013.01); *H01M 10/056* (2013.01); *H01M 10/0525* (2013.01); *H01M 10/0561* (2013.01); *H01M 10/0562* (2013.01); *H01M 10/0585* (2013.01); *C23C 14/568* (2013.01); *H01M 2220/30* (2013.01); *H01M 2300/002* (2013.01); *H01M 2300/0068* (2013.01)

(58) Field of Classification Search
None
See application file for complete search history.

(56) References Cited

U.S. PATENT DOCUMENTS

| | | | |
|---|---|---|---|
| 5,597,660 A * | 1/1997 | Bates | ...................... H01L 23/58 429/322 |
| 6,344,366 B1 | 2/2002 | Bates | |

(Continued)

OTHER PUBLICATIONS

Wang et al., "Characterization of Thin-Film Rechargeable Lithium Batteries with Lithium Cobalt Oxide Cathodes", J. Electrochem. Soc., vol. 134, No. 10, (Oct. 1996), pp. 3203-3213.*

(Continued)

*Primary Examiner* — Gregg Cantelmo

(57) ABSTRACT

Embodiments provided herein describe solid-state lithium batteries and methods for forming such batteries. A first current collector is provided. A first layer is formed above the first current collector. The first layer includes lithium and cobalt. The first layer is annealed. A second layer is formed above the annealed first layer. The second layer includes lithium and cobalt, and the annealed first layer and the second layer jointly form a first electrode. An electrolyte is formed above the first electrode. A second electrode is formed above the electrolyte. A second current collector is formed above the second electrode.

20 Claims, 10 Drawing Sheets

(51) Int. Cl.
*C23C 14/34* (2006.01)
*C23C 14/56* (2006.01)

(56) References Cited

U.S. PATENT DOCUMENTS

| | | |
|---|---|---|
| 7,959,769 B2 | 6/2011 | Zhang et al. |
| 2002/0127175 A1* | 9/2002 | Gao ................. C01G 51/42 423/594.6 |
| 2005/0130032 A1* | 6/2005 | Krasnov ............. H01M 4/0402 429/152 |
| 2006/0134522 A1 | 6/2006 | Zhang et al. |
| 2008/0213664 A1* | 9/2008 | Krasnov ............. H01M 4/0426 429/220 |
| 2009/0057136 A1* | 3/2009 | Wang ..................... C23C 14/08 204/192.15 |
| 2010/0242265 A1 | 9/2010 | Wadley et al. |
| 2011/0287296 A1 | 11/2011 | Sabi et al. |

OTHER PUBLICATIONS

Julien et al., "Combustion synthesis and characterization of substituted lithium cobalt oxides in lithium batteries", Solid State Ionics 135 (2000), pp. 241-248.*

* cited by examiner

SOLID-STATE BATTERIES UTILIZING TEMPLATE LAYERS FOR ELECTRODE FORMATION AND METHODS FOR FORMING THE SAME

TECHNICAL FIELD

The present invention relates to solid-state batteries. More particularly, this invention relates to solid-state lithium batteries utilizing template layers for electrode formation and methods for forming such batteries.

BACKGROUND

As electronic devices continue to get smaller, while the performance thereof continues to improve, there is an ever growing need for smaller, lighter, and more powerful batteries that demonstrate suitable reliability and longevity.

One possible solution for these batteries is solid-state lithium batteries. Current goals with respect to solid-state lithium batteries include a volumetric energy density greater than 1000 Watt hours per liter (Whr/L). Ideally, the batteries would be able to cycle to 500 cycles with less than 20% volumetric energy density loss at temperatures between 30° C. and 40° C. It is also desirable to keep the batteries, and of the components therein, as thin as possible while maintaining such performance.

Using conventional materials, such as lithium-cobalt oxide, in the cathodes of the batteries typically requires the cathode to be at least 10 micrometers thick for the overall system to have an energy density that greater than 625 Whr/L, let alone higher.

However, current lithium-cobalt oxide electrodes grown on conductive films (e.g. gold) are limited to a thickness of about 4 micrometers. When the thickness is increased to greater than 5 micrometers, the electrodes exhibit decreased utilization at charge rates above C/5. This decreased utilization is due to crystallographic defects, improperly oriented crystal texture, increased electrical resistance, and other mechanisms which impede lithium ion diffusion.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
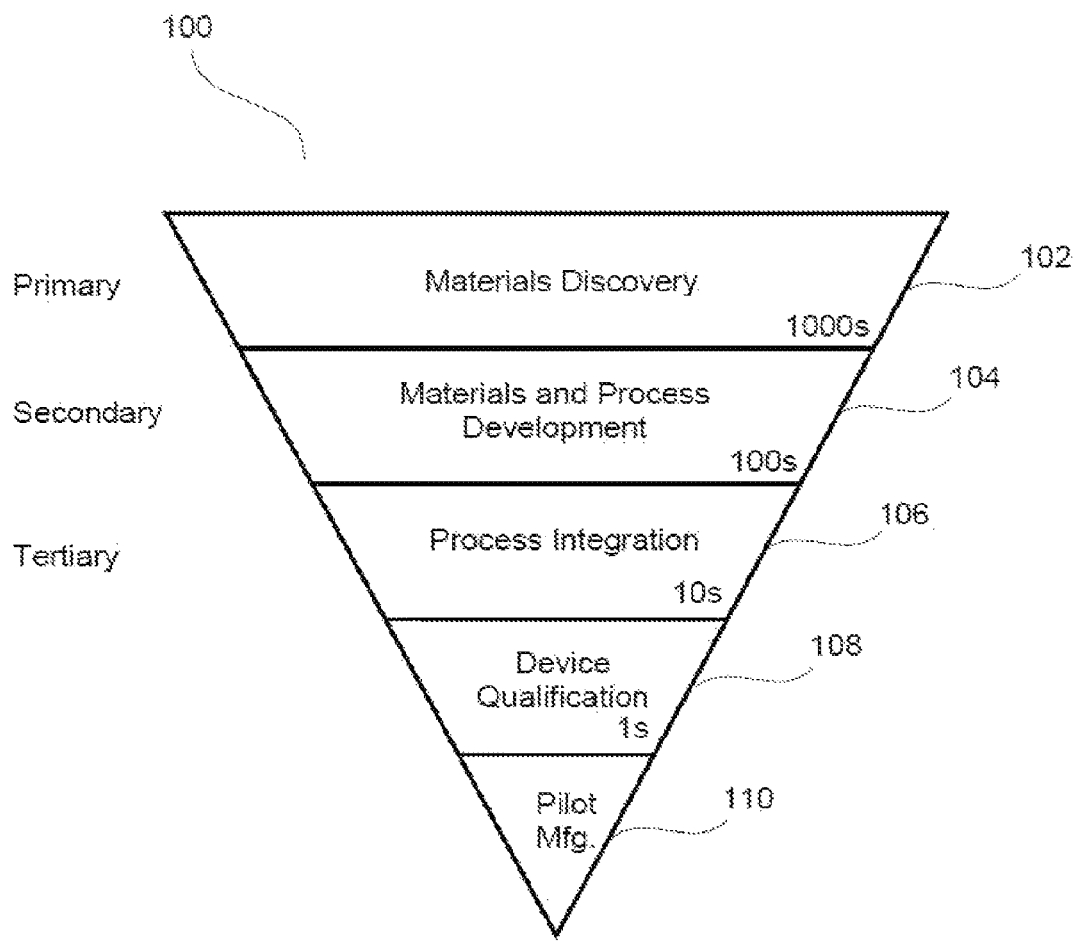
FIG. 1 illustrates a schematic diagram for implementing combinatorial processing and evaluation using primary, secondary, and tertiary screening.

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

In some embodiments, the solid-state batteries, and methods for forming such batteries, are provided. The batteries include electrodes with fewer crystallographic defects, improved crystal texture, decreased electrical resistance, and improved lithium ion diffusion compared to electrodes formed using convention methods. In some embodiments, the electrodes described herein are formed using a template, or seed layer. In particular, in some embodiments, a relatively thin lithium-cobalt oxide film is first grown on a conductive metal film. This template/seed layer is formed using PVD (e.g., sputtering) and may have a thickness of between about 1 and 5 micrometers, preferably between about 1 and 3 micrometers. The template layer is then annealed to create (or enhance) a (110) or (101) crystallographic orientation in the material thereof.

The deposition of lithium-cobalt oxide is continued to the desired thickness (e.g., 10 micrometers, or more). In some embodiments, during the second phase of deposition, dopants (e.g., aluminum, manganese, vanadium, titanium, and/or nickel) are added to enhance the conductivity and stabilize the crystallographic structure of the subsequent film (e.g., a solid electrolyte). In some embodiments, the formation of a solid state lithium battery is continued by successively forming a solid electrolyte, a second electrode, and a second current collector above the lithium cobalt oxide electrode.

In some embodiments, combinatorial methods and systems for evaluating and developing solid-state lithium batteries and/or the materials thereof are also provided. In some embodiments, a plurality of regions (e.g., site-isolated regions) is designated on at least one substrate (e.g., a glass substrate). A first solid-state lithium battery material (e.g., chromium-doped manganese oxide) is formed on a first of the plurality of regions on the at least one substrate with a first set of processing conditions. A second solid-state lithium battery material is formed on a second of the plurality of regions on the at least one substrate with a second set of processing conditions. The second set of processing conditions is different than the first set of processing conditions. However, it should be understood, that in some embodiments, the use of the same set of processing conditions may be repeated on several of the regions (or one or more substrate) to test for consistency and repeatability.

The first solid-state lithium battery material and the second solid-state lithium battery material may then be characterized. In some embodiments, the characterizing of the solid-state lithium battery material(s) includes testing or evaluating the solid-state lithium battery material(s) with respect to properties relevant to the use of the solid-state lithium battery material(s) in solid-state lithium batteries (e.g., volumetric energy density). One of the first set of processing conditions and the second set of processing conditions may be selected based on the characterizing of the first solid-state lithium battery material and the second solid-state lithium battery material.

As such, in accordance with some embodiments, combinatorial processing may be used to produce and evaluate different materials, substrates, chemicals, consumables, processes, coating stacks, and techniques related to solid-state lithium battery materials, as well as build structures or determine how solid-state lithium battery materials coat, fill or interact with existing structures in order to vary materials, unit processes and/or process sequences across multiple site-isolated regions on the substrate(s). These variations may relate to specifications such as temperatures, exposure times, layer thicknesses, chemical compositions of majority and minority elements of layers, gas compositions, chemical compositions of wet and dry surface chemistries, power and pressure of sputter deposition conditions, humidity, etc. of the formulations and/or the substrates at various stages of the screening processes described herein. However, it should be noted that in some embodiments, the chemical composition (e.g., of the solid-state lithium battery material and/or of the other components) remains the same, while other parameters are varied, and in other embodiments, the chemical composition is varied.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as solid-state batteries. In particular, there is a need to be able to test i) more than one material, ii) more than one processing condition, iii) more than one sequence of processing conditions, iv) more than one process sequence integration flow, and combinations thereof, collectively known as "combinatorial process sequence integration," on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574, filed on Feb. 10, 2006, U.S. Pat. No. 7,824,935, filed on Jul. 2, 2008, U.S. Pat. No. 7,871,928, filed on May 4, 2009, U.S. Pat. No. 7,902,063, filed on Feb. 10, 2006, and U.S. Pat.No. 7,947,531, filed on Aug. 28, 2009, which are all herein incorporated by reference. Systems and methods for HPC processing are further described in U.S. patent application Ser. No. 11/352,077, filed on Feb. 10, 2006, and now issued as U.S. Pat. No. 8,084,400, claiming priority from Oct. 15, 2005, U.S. patent application Ser. No. 11/419,174, filed on May 18, 2006, and now issued as U.S. Pat. No. 8,772,772, claiming priority from Oct. 15, 2005, U.S. patent application Ser. No. 11/674,132, filed on Feb. 12, 2007, and now abandoned, claiming priority from Oct. 15, 2005, and U.S. patent application Ser. No. 11/674,137, filed on Feb. 12, 2007, and now abandoned, claiming priority from Oct. 15, 2005, which are all herein incorporated by reference.

HPC processing techniques have been successfully adapted to wet chemical processing such as etching and cleaning HPC processing techniques have also been successfully adapted to deposition processes such as physical vapor deposition (PVD), atomic layer deposition (ALD), and chemical vapor deposition (CVD).

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated (e.g., with respect to properties relevant to use of the material(s) in solid-state lithium batteries), and promising candidates are advanced to the secondary screen, or materials and process development stage 104.

Evaluation, or testing, performed on the materials and/or devices related to solid-state batteries may include testing related to the volumetric energy density (i.e., Coulombs per unit volume), average voltage during discharge, utilization at various discharge rates, and/or cycle life, or number of charge and discharge cycles until the battery retains a particular amount (e.g. 80%) of its initial capacity. Evaluation may also be performed using various methods, such as atomic force microscopy (AFM), scanning electron microscopy (SEM), optical transmission and reflectance testing, X-Ray Diffraction (XRD), X-Ray Fluorescence (XRF), or any combination thereof.

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of, for example, device manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums (i.e., where the best conditions and materials for each manufacturing unit operation is considered in isolation), the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the device. For example, such structures may include, but would not be limited to, barrier layers, reflective layers, dielectric layers, or any other series of layers or unit processes that create an intermediate structure found on devices such as low-e panels. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a chemical composition or thickness of a layer is between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
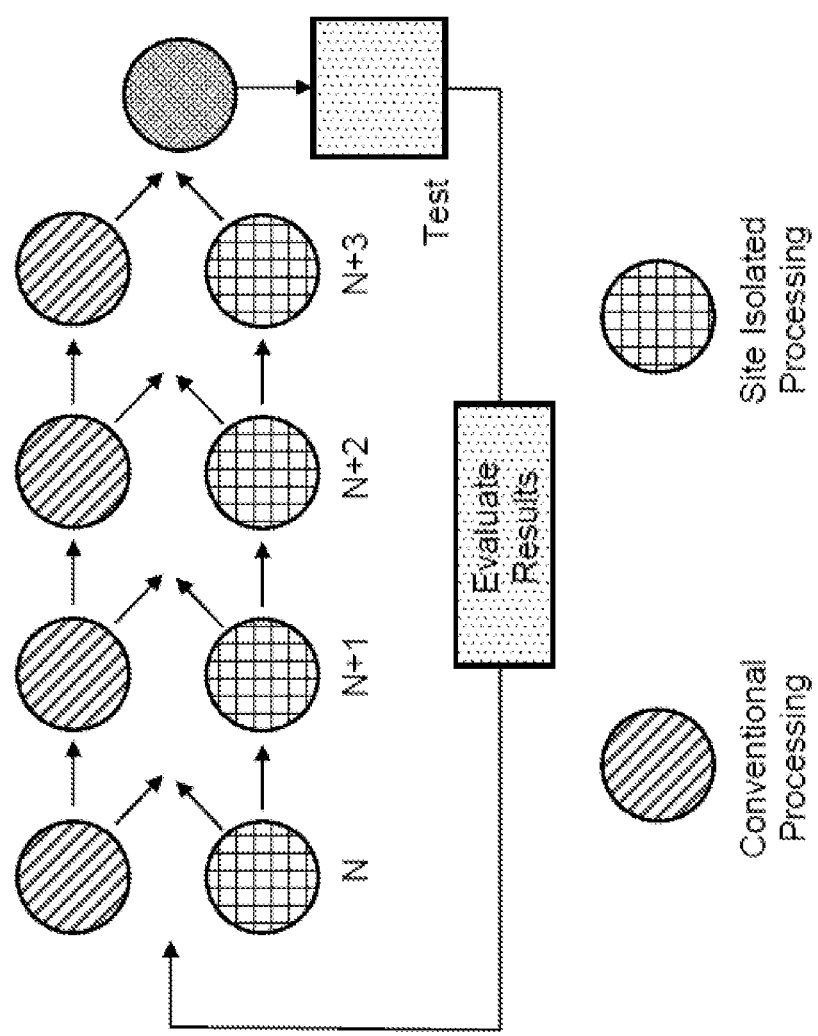
FIG. 2 is a simplified schematic diagram illustrating a general methodology for combinatorial process sequence integration that includes site isolated processing and/or conventional processing in accordance with some embodiments.

FIG. 2 is a simplified schematic diagram illustrating a general methodology for combinatorial process sequence integration that includes site isolated processing and/or conventional processing in accordance with some embodiments. In some embodiments, the substrate is initially processed using conventional process N. In some embodiments, the substrate is then processed using site isolated process N+1. During site isolated processing, an HPC module may be used, such as the HPC module described in U.S. patent application Ser. No. 11/352,077, filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The characterization (or testing) may be performed using various methods, such as atomic force microscopy (AFM), scanning electron microscopy (SEM), optical transmission and reflectance testing, X-Ray Diffraction (XRD), X-Ray Fluorescence (XRF), or any combination thereof.

The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in device manufacturing may be varied.

Figure 3:
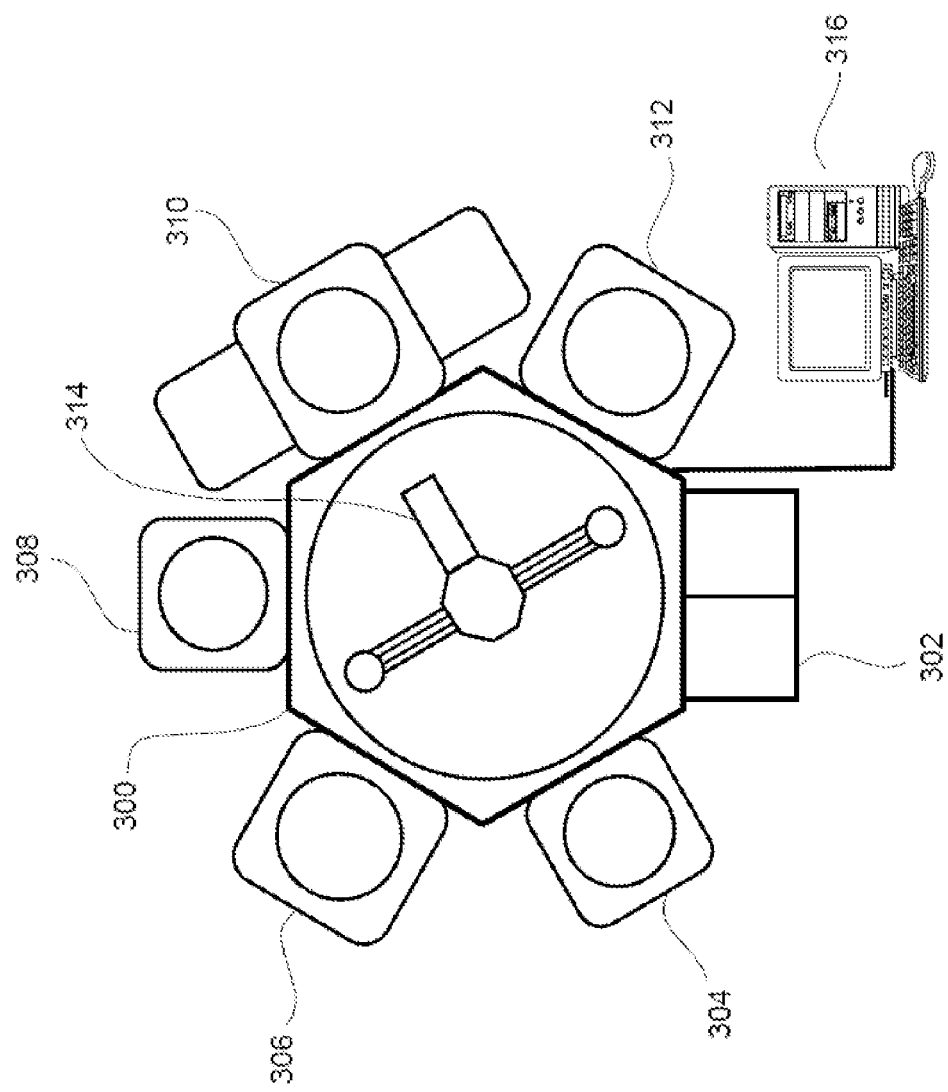
FIG. 3 is a simplified schematic diagram illustrating an integrated high productivity combinatorial (HPC) system in accordance with some embodiments.

FIG. 3 is a simplified schematic diagram illustrating an integrated high productivity combinatorial (HPC) system in accordance with some embodiments. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules (or processing tools) 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. No. 11/672,478 filed Feb. 7, 2007, now U.S. Pat. No. 7,867,904 and claiming priority to U.S. Provisional Application No. 60/832,248 filed on Jul. 19, 2006, and U.S. application Ser. No. 11/672,473, filed Feb. 7, 2007, and claiming priority to U.S. Provisional Application No. 60/832,248 filed on Jul. 19, 2006, which are all herein incorporated by reference. With HPC system, a plurality of methods may be employed to deposit material upon a substrate employing combinatorial processes.

Figure 4:
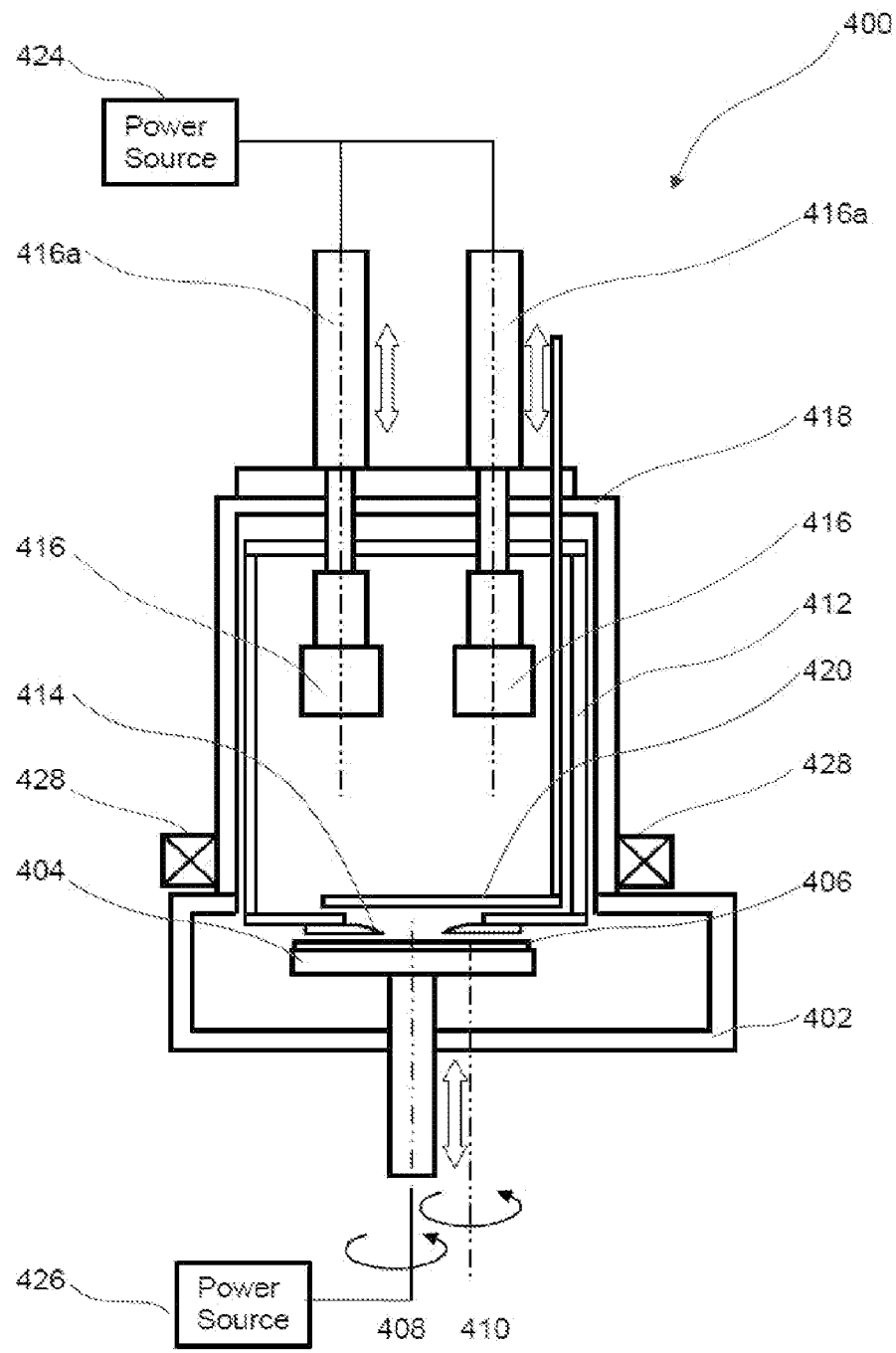
FIG. 4 is a simplified schematic diagram illustrating a sputter processing chamber configured to perform combinatorial processing and full substrate processing in accordance with some embodiments.

FIG. 4 is a simplified schematic diagram illustrating a PVD chamber (or processing tool), more particularly, a sputter chamber, configured to perform combinatorial processing and full substrate processing in accordance with some embodiments. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406 and produces a negative bias voltage on substrate 406. In some embodiments, power source 426 provides a radio frequency (RF) power sufficient to take advantage of the high metal ionization to improve step coverage of vias and trenches of patterned wafers. In some embodiments, the RF power supplied by power source 426 is pulsed and synchronized with the pulsed power from power source 424.

Substrate 406 may be a conventional round 200 mm, 300 mm, or any other larger or smaller substrate/wafer size. In some embodiments, substrate 406 may be a square, rectangular, or other shaped substrate. In some embodiments, substrate 406 is made of glass. However, in other embodiments, the substrate 406 is made of a semiconductor material, such as silicon. One skilled in the art will appreciate that substrate 406 may be a blanket substrate, a coupon (e.g., partial wafer), or even a patterned substrate having predefined regions. In some embodiments, substrate 406 may have regions defined through the processing described herein. The term region is used herein to refer to a localized (or site-isolated) area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in a site-isolated manner (e.g., such that only the particular region on the substrate is processed) in some embodiments. In other embodiments, full wafer processing can be achieved by optimizing gun tilt angle and target-to-substrate spacing, and by using multiple process guns 416. Process kit shield 412 is capable of being moved in and out of chamber 400 (i.e., the process kit shield is a replaceable insert). In other embodiments, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture, 414, in some embodiments. In other embodiments, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and aperture shutter 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

Although only two process guns 416 are visible in FIG. 4, any number of process guns may be included (e.g., one, three, four or more process guns). Process guns 416 are moveable in a vertical direction so that one or both of the guns may be lifted from the slots of the shield. Where more than one process gun is included, the plurality of process guns may be referred to as a cluster of process guns. In some embodiments, process guns 416 are oriented or angled so that a normal reference line extending from a planar surface of the target of the process gun is directed toward an outer periphery of the substrate in order to achieve good uniformity for full substrate deposition. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a which are fixed to process guns 416 may be attached to a suitable drive, (i.e., lead screw, worm gear, etc.), configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in other embodiments. In yet other embodiments, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck. As mentioned above, the output of power source 426 is synchronized with the output of power source 424. It should be appreciated that power source 424 may output a direct current (DC) power supply or a radio frequency (RF) power supply. In other embodiments, the DC power is pulsed and the duty cycle is less than 30% on-time at maximum power in order to achieve a peak power of 10-15 kilowatts. Thus, the peak power for high metal ionization and high density plasma is achieved at a relatively low average power which will not cause any target overheating/cracking issues. It should be appreciated that the duty cycle and peak power levels are exemplary and not meant to be limiting as other ranges are possible and may be dependent on the material and/or process being performed.

Although not shown in detail, each of the sputter guns 416 may include a target that includes one or more materials to be deposited onto the substrate 406. In some embodiments, the various materials included in the target(s) are suitable for forming solid-state lithium batteries, such as gold, platinum, lithium, phosphorous, manganese, chromium, titanium, nickel, tungsten, scandium, vanadium, iron, cobalt, copper, yttrium, zirconium, lanthanum, hafnium, molybdenum, tantalum, and/or combinations thereof.

Using processing chamber 400, perhaps in combination with other processing tools, solid-state lithium battery materials may be developed and evaluated in the manner described above. In particular, in some embodiments, solid-state battery materials may be formed (or deposited) on different (i.e., two or more) site-isolated regions of substrate 406 (or on multiple substrates) under varying processing conditions (including, for example, the formation/deposition of different solid-state lithium battery materials). For example, (a first) solid-state battery material may be ejected from one of more of targets and deposited onto a first of the regions on substrate 406 under a first set of processing conditions, and either sequentially or simultaneously, (a second) solid-state battery material may be ejected from one of more of targets and deposited onto a second of the regions on substrate 406 under a different, second set of processing conditions.

The solid-state battery material(s) (and/or processing conditions) may then be characterized. In some embodiments, the characterizing of the solid-state battery material(s) includes testing or evaluating the solid-state battery material(s) with respect to properties relevant to the use of the materials in solid-state batteries. Particular materials and/or processing conditions may then be selected (e.g., for further testing or use in devices) based on the desired parameters or properties.

Figure 6:
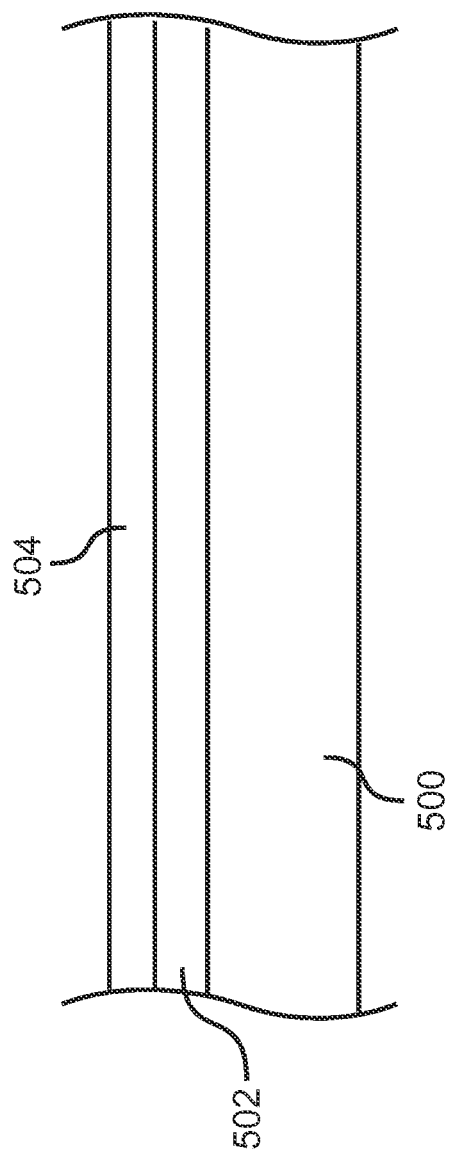

It should be understood that the development of the solid-state battery materials may involve the use of multiple processing tools, such as modules 304-312 in FIG. 3. For example, various other materials/layers (e.g., as shown in FIG. 6), in addition to the first electrode (or cathode), may be formed on each site-isolated region on the substrate, and additional processing steps, such as cleanings, may be performed at various stages of the processing, in processing tools/chambers different from the one in which the solid-state battery material(s) is formed. This processing may utilize several of the modules 304-312 and involve transporting the substrate between the modules in a controlled environment (e.g., without breaking vacuum).

Figure 5:
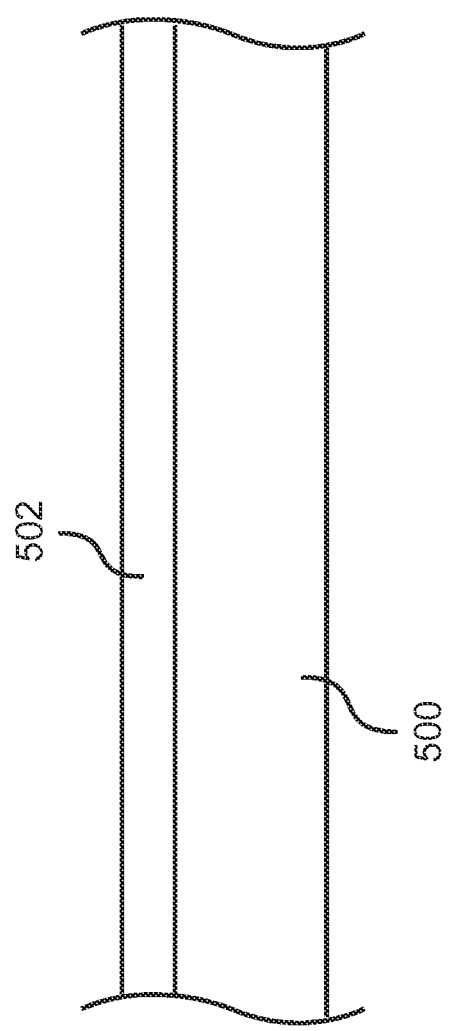
FIGS. 5, 6, 7, and 8 are cross-sectional views of a substrate, illustrating the formation of a current collector and electrode above.

FIGS. 5-8 are cross-sectional views of a substrate, illustrating a method for forming an electrode for a solid-state lithium battery, according to some embodiments. Referring to FIG. 5, a substrate 500 is provided. In some embodiments, the substrate 500 includes (or is made of) aluminum oxide (e.g., alumina), silicon oxide (e.g., silica), zirconium oxide (e.g., zirconia), aluminum nitride, a semiconductor material, such as silicon and/or germanium, a metal foil (e.g., aluminum, titanium, stainless steel, etc.), and/or a polymer or plastic. The substrate 500 may have a thickness of, for example, between about 50 µm and about 500 µm.

Still referring to FIG. 5, a current collector 502 is formed above the substrate 500. In some embodiments, the current collector 502 includes (or is made of) a noble metal, such as gold, platinum, cobalt, palladium, or a combination thereof. The current collector 502 may have a thickness of, for example, between about 0.1 µm and about 3.0 µm. In some embodiments, the cathode current collector 512 includes a layer of cobalt (e.g., 0.1 µm thick) and a thinner layer of gold formed over the cobalt. The current collector may be formed using any suitable process, such as physical vapor deposition (PVD) (e.g., sputtering) or plating.

As shown in FIG. 6, a first layer (or a first electrode layer) 504 is then formed above the current collector 502. In some embodiments, the first layer 504 includes lithium and cobalt. For example, the first layer 504 may be made of lithium-cobalt oxide. The first layer 504 may be formed using, for example, PVD (e.g., sputtering). In some embodiments, the first layer 504 may be formed using a co-sputtering process in which lithium is sputtered from a first PVD target and cobalt oxide is simultaneously sputtered from a second target.

The first layer 504 may have a thickness of, for example, between about 1 µm and about 5 µm, preferably between about 1 µm and about 3 µm. In some embodiments, after the deposition process is complete, at least some of the material of the first layer 504 may have a (003) crystallographic orientation.

Figure 7:
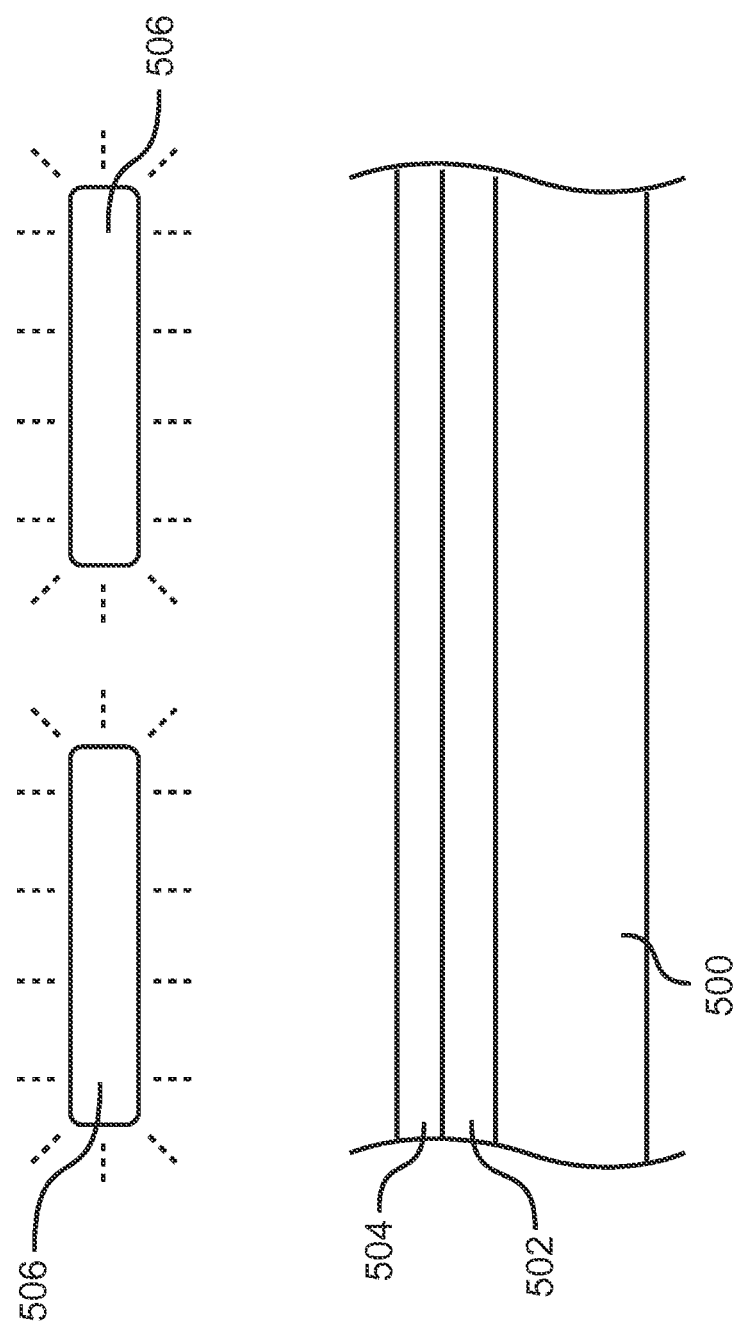

Referring now to FIG. 7, the substrate 500, as well as the current collector 502 and the first layer 504, are subjected to a heating process to, for example, to anneal the first layer 504, in order to adjust the crystallographic orientation of the material of the first layer 504. In some embodiments, the heating process is performed using heating elements 506. The heating process may be performed in the same processing chamber in which the first layer 504 (and perhaps the current collector 502) is formed (i.e., "in situ"). Alternatively, the heating process may be performed in a different processing chamber than that used to form the first layer 504 (i.e., "ex situ").

In some embodiments, the first layer 504 is heated to a temperature of, for example, between about 600° C. and about 800° C. during the heating process. The heating process may be performed in a gaseous environment including oxygen, nitrogen, argon, and/or hydrogen (e.g., 80% nitrogen, 20% oxygen) with either ambient humidity, or no humidity. In some embodiments, the heating process is performed for a duration of, for example, greater than 30 minutes (e.g., 30-60 minutes). The heating process may utilize a temperature ramp rate of, for example, between about 5° C. and about 10° C. per minute (e.g., starting from room temperature).

After the heating process, at least some of the material of the first layer 504 may have a (110) or (101) crystallographic orientation. More specifically, in some embodiments, after the heating process, at least 30% by volume of the material of the first layer 504 has a (110) or (101) crystallographic orientation, as, as determined by a technique such as XRD.

Figure 8:
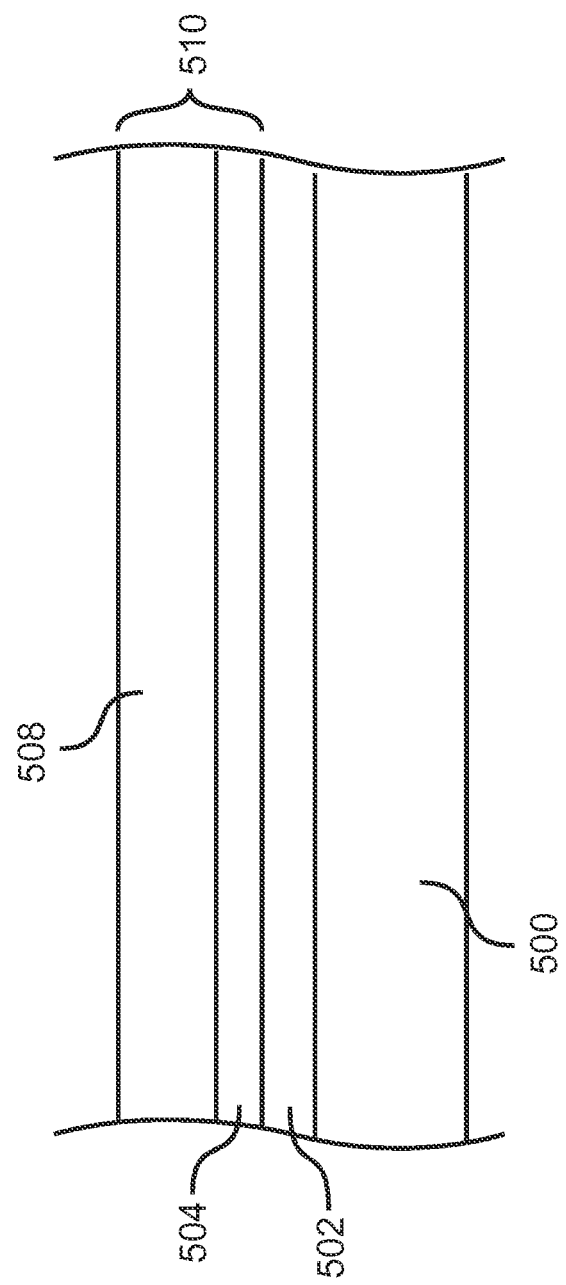

Next, as shown in FIG. 8, a second layer (or a second electrode layer) 508 is formed above the first layer 504. The second layer 508 may include (or be made of) the same material(s) as the first layer 504 (e.g., lithium-cobalt oxide) and be formed using the same process (e.g., sputtering). In some embodiments, the second layer 508 is doped (i.e., with one or more materials besides lithium and cobalt). The dopant(s) may include aluminum, manganese, vanadium, titanium, nickel, or a combination thereof, and may be introduced, for example, during the deposition process. For example, in embodiments in which the second layer 508 is formed using PVD, the dopant(s) may be included in the target(s) from which the material is ejected.

In some embodiments, the second layer 508 has a thickness of, for example, between about 5 µm and 9 µm, or more. Thus, the first layer 504 and the second layer 508 may be considered to jointly form a solid-state lithium battery electrode (e.g., a cathode) 510, or more particularly, a "two-phase" electrode, that has a thickness of, for example, at least 10 µm (e.g., 10-20 µm).

During the formation of the second layer 508, the first layer 504 may function as a template, or seed, layer. That is, the crystallographic orientation of the first layer 504 (e.g., (110) or (101)) may cause the material of the second layer 508 to arrange in predominantly the same crystallographic orientation during the formation of the second layer 508. As such, in some embodiments, the electrode 510 has predominantly a (110) or (101) crystallographic orientation. More specifically, in some embodiments, after the heating process, at least 30% by volume of the material of the electrode 510 has a (110) or (101) crystallographic orientation, as, as determined by a technique such as XRD.

Figure 9:
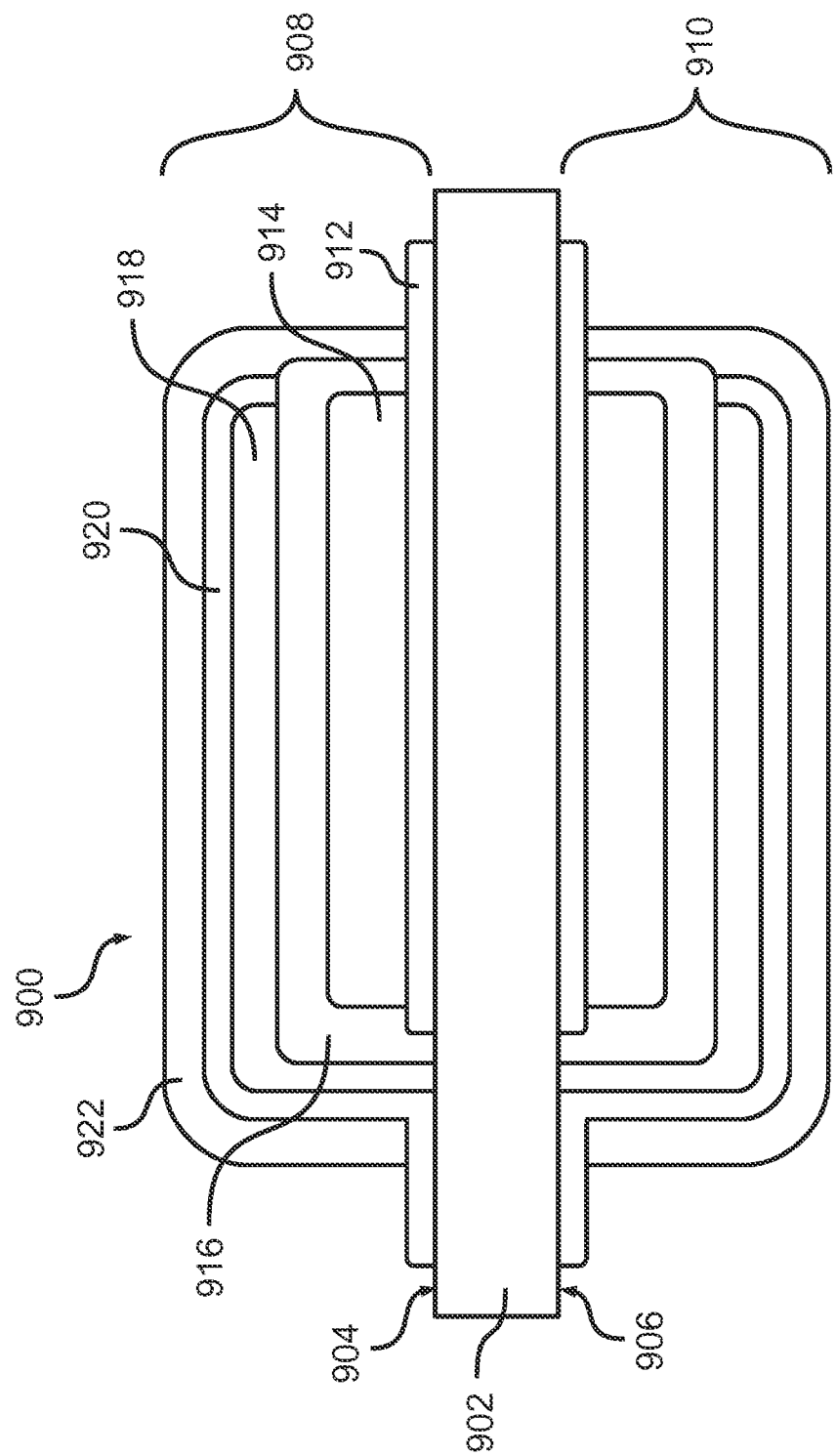
FIG. 9 is a cross-sectional side view of a solid-state lithium battery according to some embodiments.

FIG. 9 illustrates a solid-state lithium battery (or battery cell) 900, according to some embodiments. The battery 900 includes a substrate 902 having a first side 904 and a second side 906. In some embodiments, the substrate 902 is similar to the substrate 500 described above. Thus, the substrate 902 may include (or be made of) aluminum oxide (e.g., alumina), silicon oxide (e.g., silica), zirconium oxide (e.g., zirconia), aluminum nitride, a semiconductor material, such as silicon and/or germanium, a metal foil (e.g., aluminum, titanium, stainless steel, etc.), and/or a polymer or plastic. The substrate may have a thickness of, for example, between about 50 µm and about 500 µm.

The embodiment shown in FIG. 9 is a "double-sided" configuration. Thus, the battery 900 includes a first battery stack 908 formed on the first side 904 of the substrate 902 and a second battery stack 910 formed on the second side 906 of the substrate 902. In some double-sided embodiments, the first and second battery stacks 908 and 910 are identical, or substantially identical. Thus, for the purposes of this description, although only the first battery stack 908 is described in detail, it should be understood that the second battery stack 910 may be identical. In other embodiments, a "single-sided" configuration is used in which a battery stack is only formed on one side of the substrate 902.

Still referring to FIG. 9, the first battery stack 908 includes a cathode (or first) current collector 912, a cathode (or first) electrode) 914, an electrolyte 916, an anode (or second electrode) 918, an anode (or second) current collector 920, and a protective layer 922.

The various layers (or components) in the battery stack 908 may be formed sequentially (i.e., from bottom to top) above the substrate 902 using, for example, physical vapor deposition (PVD) and/or reactive sputtering processing, or any other processes (e.g., plating) that are suitable depending on the material(s), thicknesses, etc. Although the components may be described as being formed "above" the previous component (or the substrate), it should be understood that in some embodiments, each layer is formed directly on (and adjacent to) the previously provided/formed component. In some embodiments, additional components (or layers) may be included between the components shown in FIG. 9 (as well as those shown in FIGS. 5-8), and other processing steps may also be performed between the formation of various components.

Still referring to FIG. 9, the cathode current collector 912 is formed above the substrate 902 (e.g., above the first side 904 of the substrate 902) and may be similar to the current collector 502 described above. In some embodiments, the cathode current collector 912 includes (or is made of) a noble metal, such as gold, platinum, cobalt, palladium, or a combination thereof. The cathode current collector 912 may have a thickness of, for example, between about 0.1 µm and about 3.0 µm. As shown in FIG. 9, the cathode current collector 912 may be selectively formed on the substrate 902 such that it does not cover some portions of the substrate 902.

The cathode (or first electrode) 914 is formed above the cathode current collector 512. Although not shown in detail in FIG. 9, the cathode 914 may be similar to the electrode 510 and may be formed in a manner similar to that described above and shown in FIGS. 5-8.

In the embodiment shown in FIG. 9, the cathode 914 is selectively formed above the cathode current collector 912 such that no portion of it is in direct contact with the substrate 902. In some embodiments, after the cathode 914 is formed, the substrate 902, the cathode current collector 912, and the cathode 914 are (again) heated (e.g., in an atmosphere of oxygen, nitrogen, argon, and/or hydrogen) in a manner similar that described above to, for example, further enhance the (110) or (101) crystallographic orientation in the cathode 914.

As shown in FIG. 9, the electrolyte 916 is formed above the cathode 914. In some embodiments, the electrolyte 916 includes, or is made of, lithium-phosphorous oxynitride (i.e., LiPON). The LiPON may be a "solid" electrolyte (i.e., an electrolyte that does not have a liquid component) formed using PVD, such as a sputtering process, such that the battery 900 is an "all solid-state" lithium battery. In some embodiments, the electrolyte 916 has a thickness of, for example, between about 1.0 µm and about 2.0 µm. As shown, in the depicted embodiment, the electrolyte 916 is formed such that cover the "ends" of the cathode 914.

The anode (or second electrode) 918 is formed above the electrolyte 916. In some embodiments, the anode 918 includes (or is made of) lithium metal. The anode 918 may have a thickness of, for example, between about 1.0 µm and 5.0 µm. In the depicted embodiment, the anode 918 is formed such that it covers an end of the electrolyte 916 opposite an exposed end of the cathode current collector 912.

The anode (or second) current collector 920 is formed above the anode 918. In some embodiments, the anode current collector 920 includes (or is made of) a conductive material that is thermodynamically and chemically stable with the material (e.g., lithium metal) of the anode 918. Suitable materials include scandium, titanium, vanadium, chromium, manganese, iron, cobalt, nickel, copper, yttrium, zirconium, lanthanum, hafnium, molybdenum, tantalum, tungsten, titanium nitride, or a combination thereof.

The anode current collector 920 may have a thickness of, for example, between about 0.1 µm and about 3.0 µm. In the depicted embodiment, the anode current collector 920 is formed such that it covers both ends of the anode 918 and a portion thereof is formed directly on an exposed portion of the substrate 902.

The protective layer 922 is formed over the anode current collector 920. In some embodiments, the protective layer 922 includes (or is made of) a nitride, such as aluminum nitride or silicon nitride. The protective layer 922 may have a thickness of, for example, between about 1.0 µm and about 30 µm. As is shown in FIG. 9, the protective layer 922 may be formed to leave portions of the cathode current collector 912 and the anode current collector 920 exposed to form electrical connections to the battery 900.

During operation of the battery 900, when the battery 900 is allowed to discharge, lithium ions (i.e., $Li^+$) migrate from the anode 918 to the cathode 914 by diffusing through the electrolyte 916. When the anode and cathode reactions are reversible, as for an intercalation compound or alloy such as LiPON, the battery 900 may be recharged by reversing the current. The difference in the electrochemical potential of the lithium determines the cell voltage. Electrical connections are made to the battery 900, for both discharging and charging, through the current collectors 912 and 920.

The use of the seed layer (i.e., the first electrode layer) in the formation of the first electrode (e.g., the cathode) allows relatively thick (e.g., 10 µm or more) films to be formed without the defects typically associated with thick, continuously grown electrodes. That is, the electrodes described herein have fewer crystallographic defects, improved crystal texture, decreased electrical resistance, and improved lithium ion diffusion. Also, the doping of the second phase (or second layer) of the electrode allows for increased conductivity and phase stability at the portions thereof farther from the substrate and current collector, where it is most effective. As a result, the electrodes described herein exhibit improved utilization, particularly at charge rates above C/5.

Figure 10:
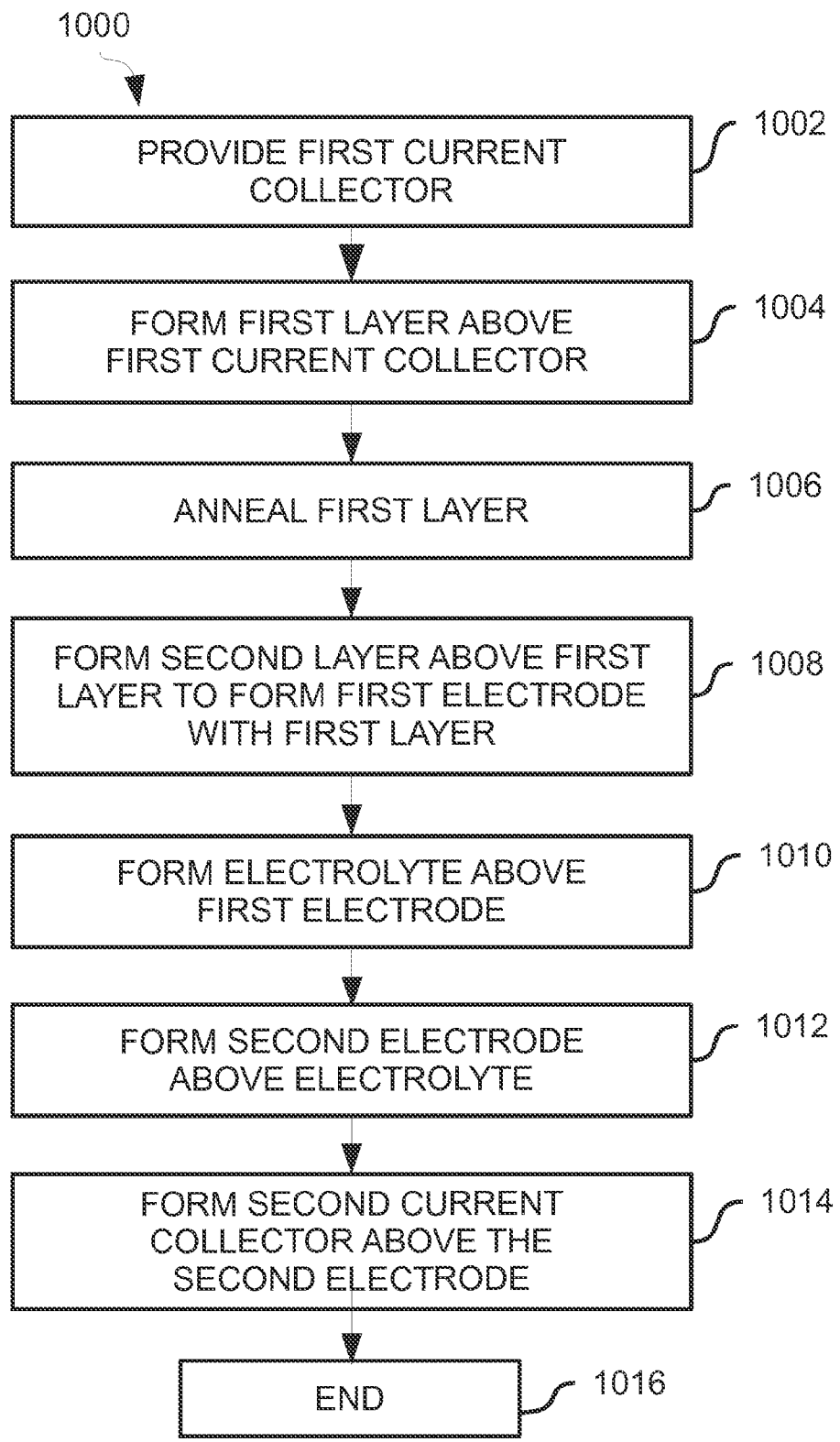
FIG. 10 is a flow chart illustrating a method for forming a solid-state battery according to some embodiments.

FIG. 10 illustrates a method 1000 for forming a solid-state lithium battery according to some embodiments. At block 1002, a first current collector (e.g., a cathode current collector) is provided. In some embodiments, the first current collector is formed above a substrate (e.g., aluminum oxide, silicon oxide, zirconium oxide, aluminum nitride, silicon, germanium, aluminum, titanium, stainless steel, and/or a polymer). The first current collector may include, for example, platinum, gold, cobalt, and/or palladium, and have a thickness of, for example, between about 0.1 µm and 3.0 µm. The first current collector may be formed using, for example, physical vapor deposition (PVD) (e.g., sputtering) or plating.

At block 1004, a first layer (or first electrode layer) is formed above the first current collector. In some embodiments, the first layer includes lithium and cobalt (e.g., lithium-cobalt oxide). The first layer may be formed using, for example, PVD (e.g., sputtering). The first layer may have a thickness of, for example, between about 1 µm and about 5 µm, preferably between about 1 µm and about 3 µm.

At block 1006, the first layer is annealed. The annealing is performed by heating the first layer (and perhaps the first current collector and the substrate). The heating process may be performed in a gaseous environment including oxygen, nitrogen, argon, and/or hydrogen (e.g., 80% nitrogen, 20% oxygen) with either ambient humidity, or no humidity. In some embodiments, the heating process is performed for a duration of, for example, greater than 30 minutes (e.g., 30-60 minutes). The heating process may utilize a temperature ramp rate of, for example, between about 5° C. and about 10° C. per minute (e.g., starting from room temperature). After the annealing process, at least some of the material of the first layer may have a (110) or (101) crystallographic orientation.

At block 1008, a second layer (or a second electrode layer) is formed above the first layer. The second layer may include the same material(s) as the first layer (e.g., lithium-cobalt oxide) and be formed using the same process (e.g., sputtering). In some embodiments, the second layer is (also) doped (i.e., with one or more materials besides lithium and cobalt). The dopant(s) may include aluminum, manganese, vanadium, titanium, nickel, or a combination thereof, and may be introduced, for example, during the deposition process. In some embodiments, the second layer has a thickness of, for example, between about 5.0 μm and 9.0 μm, or more. The first layer and the second layer may be considered to jointly form a solid-state lithium battery electrode (e.g., a cathode) that has a thickness of, for example, at least 10 μm.

At block 1010, an electrolyte is formed above the first electrode. The electrolyte may be a solid electrolyte formed, or deposited, using a PVD process. In some embodiments, the electrolyte includes LiPON and has a thickness of, for example, between about 1.0 μm and about 2.0 μm.

At block 1012, a second electrode (e.g., an anode) is formed above the electrolyte. The second electrode may include lithium metal and have a thickness of, for example, between 1.0 μm and 5.0 μm. In some embodiments, the second electrode is formed using PVD (e.g., sputtering).

At block 1014, a second current collector (e.g., an anode current collector) is formed above the second electrode. In some embodiments, the second current collector includes scandium, titanium, vanadium, chromium, manganese, iron, cobalt, nickel, copper, yttrium, zirconium, lanthanum, hafnium, molybdenum, tantalum, tungsten, titanium nitride, or a combination thereof. The second current collector may have a thickness of, for example, between about 0.1 μm and about 3.0 μm and be formed using a PVD process.

Although not shown in FIG. 10, a protective layer (e.g., a nitride) may be formed above the second current collector (e.g., using PVD). Additionally, in some embodiments, two sets of the components of the battery are formed on opposing sides of the substrate (i.e., a double-sided configuration), while in other embodiments, the components are only formed on one side of the substrate (i.e., a single-sided configuration). At block 1016, the method 1000 ends.

Thus, in some embodiments, methods for forming a solid-state battery are provided. A first current collector is provided. A first layer is formed above the first current collector. The first layer includes lithium and cobalt. The first layer is annealed. A second layer is formed above the annealed first layer. The second layer includes lithium and cobalt, and the annealed first layer and the second layer jointly form a first electrode. An electrolyte is formed above the first electrode. A second electrode is formed above the electrolyte. A second current collector is formed above the second electrode.

In some embodiments, methods for forming a solid-state lithium battery are provided. A first current collector is provided. The first current collector is formed above a substrate. A first layer is formed above the first current collector. The first layer includes lithium and cobalt and has a thickness of between about 1 μm and about 5 μm. The first layer is annealed. A second layer is formed above the annealed first layer. The second layer includes lithium and cobalt, and the annealed first layer and the second layer jointly form a first electrode. The first electrode has a thickness of about 10 μm or more. An electrolyte is formed above the first electrode. A second electrode is formed above the electrolyte. A second current collector is formed above the second electrode.

In some embodiments, methods for forming a solid-state lithium battery are provided. A substrate is provided. A first current collector is formed above the substrate. A first layer is formed above the first current collector. The first layer includes lithium-cobalt oxide and has a thickness of between about 1 μm and about 5 μm. The first layer is heated at a temperature of between about 600° C. and about 800° C. A second layer is formed above the first layer. The second layer includes lithium-cobalt oxide, and the first layer and the second layer jointly form a first electrode. The first electrode has a thickness of about 10 μm or more. A solid electrolyte is formed above the first electrode. A second electrode is formed above the solid electrolyte. The second electrode comprises lithium. A second current collector is formed above the second electrode.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a solid-state battery, the method comprising:
   providing a first current collector;
   forming a first layer above the first current collector, wherein the first layer consists of lithium-cobalt oxide;
   annealing the first layer;
   forming a second layer above the annealed first layer, wherein the second layer comprises lithium, cobalt, and at least one of aluminum, manganese, vanadium, titanium, nickel, or a combination thereof, and the annealed first layer and the second layer jointly form a first electrode;
   forming an electrolyte above the first electrode;
   forming a second electrode above the electrolyte; and
   forming a second current collector above the second electrode.

2. The method of claim 1, wherein the annealing the first layer comprises heating the first layer at a temperature of between 600° C. and 800° C.

3. The method of claim 2, wherein a thickness of the first layer is between 1 micrometer (μm) and 5 μm.

4. The method of claim 3, wherein the thickness of the thickness of the first layer is between 1 μm and 3 μm.

5. The method of claim 4, wherein the second layer comprises lithium-cobalt oxide doped with at least one of aluminum, manganese, vanadium, titanium, nickel, or a combination thereof.

6. The method of claim 5, wherein a thickness of the first electrode is between 10 μm and 20 μm.

7. The method of claim 1, wherein the electrolyte comprises lithium-phosphorous oxynitride, and the second electrode comprises lithium.

8. The method of claim 5, wherein the second layer consists of lithium-cobalt oxide doped with at least one of aluminum, manganese, vanadium, titanium, nickel, or a combination thereof.

9. The method of claim 8, wherein the first current collector comprises gold, platinum, or a combination thereof, and wherein the second current collector comprises at least one of scandium, titanium, vanadium, chromium, manganese, iron, cobalt, nickel, copper, yttrium, zirconium, lanthanum, hafnium, molybdenum, tantalum, tungsten, titanium nitride, or a combination thereof.

10. The method of claim 1, wherein the forming of the first layer, the forming of the second layer, the forming of the electrolyte, and the forming of the second electrode are performed using physical vapor deposition (PVD).

11. A method for forming a solid-state lithium battery, the method comprising:
providing a first current collector, wherein the first current collector is formed above a substrate;
forming a first layer above the first current collector, wherein the first layer consists of lithium-cobalt oxide and has a thickness of between 1 micrometer (μm) and 5 μm;
annealing the first layer;
forming a second layer directly on the annealed first layer, wherein the second layer comprises lithium-cobalt oxide doped with at least one of aluminum, manganese, vanadium, titanium, nickel, or a combination thereof, and the annealed first layer and the second layer jointly form a first electrode, the first electrode having a thickness of between 10 μm and 20 μm;
forming an electrolyte above the first electrode;
forming a second electrode about the electrolyte; and
forming a second current collector above the second electrode.

12. The method of claim 11, wherein the second layer consists of lithium-cobalt oxide doped with at least one of aluminum, manganese, vanadium, titanium, nickel, or a combination thereof.

13. The method of claim 12, wherein the electrolyte comprises lithium-phosphorous oxynitride, and the second electrode comprises lithium.

14. The method of claim 13, wherein the annealing the first layer comprises heating the first layer at a temperature of between 600° C. and 800° C.

15. The method of claim 14, wherein the forming of the first layer, forming of the second layer, the forming of the electrolyte, and the forming of the second electrode are performed using physical vapor deposition (PVD).

16. A method for forming a solid-state lithium battery, the method comprising:
providing a substrate;
forming a first current collector above the substrate;
forming a first layer above the first current collector, wherein the first layer consists of lithium-cobalt oxide and has a thickness of between 1 micrometer (μm) and 5 μm;
heating the first layer at a temperature of between 600° C. and 800° C.;
forming a second layer about the first layer, wherein the second layer comprises lithium-cobalt oxide doped with at least one of aluminum, manganese, vanadium, titanium, nickel, or a combination thereof, and the first layer and the second layer jointly form a first electrode, the first electrode having a thickness of between 10 μm and 20 μm;
forming a solid electrolyte about the first electrode;
forming a second electrode above the solid electrolyte, wherein the second electrode comprises lithium; and
forming a second current collector above the second electrode.

17. The method of claim 16, wherein the forming of the first layer, the forming of the second layer, the forming of the solid electrolyte, and the forming of the second electrode are performed using physical vapor deposition (PVD).

18. The method of claim 17, wherein the solid electrolyte comprises lithium-phosphorous oxynitride.

19. The method of claim 18, wherein the substrate has a plurality of site-isolated regions defined thereon, and the forming of the first current collector, the forming of the first layer, the forming of the second layer, the forming of the solid electrolyte, the forming of the second electrode, and the forming of the second current collector cause a first solid-state lithium battery to be formed above a first of the plurality of site-isolated regions using a first set of processing conditions, and further comprising:
forming a second solid-state lithium battery above a second of the plurality of site-isolated regions using a second set of processing conditions, the second set of processing conditions being different than the first set of processing conditions;
evaluating the first solid-state lithium battery and the second solid-state lithium battery; and
based on the evaluating, selecting one of the first set of processing conditions and the second set of processing conditions.

20. The method of claim 19, wherein each of the first set of processing conditions and the second set of processing conditions comprises processing temperatures, component thicknesses, component chemical compositions, processing gas compositions, sputter deposition conditions, or a combination thereof, and wherein the evaluating the first solid-state lithium battery and the second solid-state lithium battery comprises testing for at least one of volumetric energy density, average voltage during discharge, utilization at various discharge rates, cycle life, and number of charge and discharge cycles until a selected amount of initial capacity is retained.

* * * * *